United States Patent [19]

Kwon

[11] Patent Number: 5,598,116

[45] Date of Patent: Jan. 28, 1997

[54] APPARATUS FOR MEASURING A PULSE DURATION

[75] Inventor: Oh-Sang Kwon, Seoul, Rep. of Korea

[73] Assignee: Daewoo Electronics, Co. Ltd., Seoul, Rep. of Korea

[21] Appl. No.: 550,332

[22] Filed: Oct. 30, 1995

[30] Foreign Application Priority Data

Oct. 31, 1994 [KR] Rep. of Korea ..................... 94-28325

[51] Int. Cl.$^6$ ..................................................... H03K 9/08
[52] U.S. Cl. ............................................................ 327/31
[58] Field of Search ..................................... 327/18, 26, 31, 327/164, 167, 172, 175, 113, 265, 279, 286, 47, 48, 36; 377/24

[56] References Cited

U.S. PATENT DOCUMENTS 4,197,502  4/1980  Sumner et al. ........................... 327/18
4,223,267  9/1980  Sartorious et al. ....................... 327/31
5,438,328  8/1995  Kweon .................................... 327/31

Primary Examiner—Toan Tran
Attorney, Agent, or Firm—Pennie & Edmonds

[57] ABSTRACT

A pulse duration measuring apparatus generates a clock signal in the form of a clock pulse train having a period(T) and delays the clock signal and provides N-1 number of delayed clock signals, each of the delayed clock signals delayed by a delay time($(T/N)*i$), N being a positive integer and i being 1 to N-1 and counts the number of the clock pulses contained in the clock signal and each of the delayed clock signals, respectively, during the duration(Y) of the input pulse signal(I) and providing the count values. A pulse duration measuring apparatus detects a maximum counted value(n) among the counted values provided from the counting means and calculates the duration(Y) of the input pulse signal(I) based on the maximum count value(n).

2 Claims, 2 Drawing Sheets

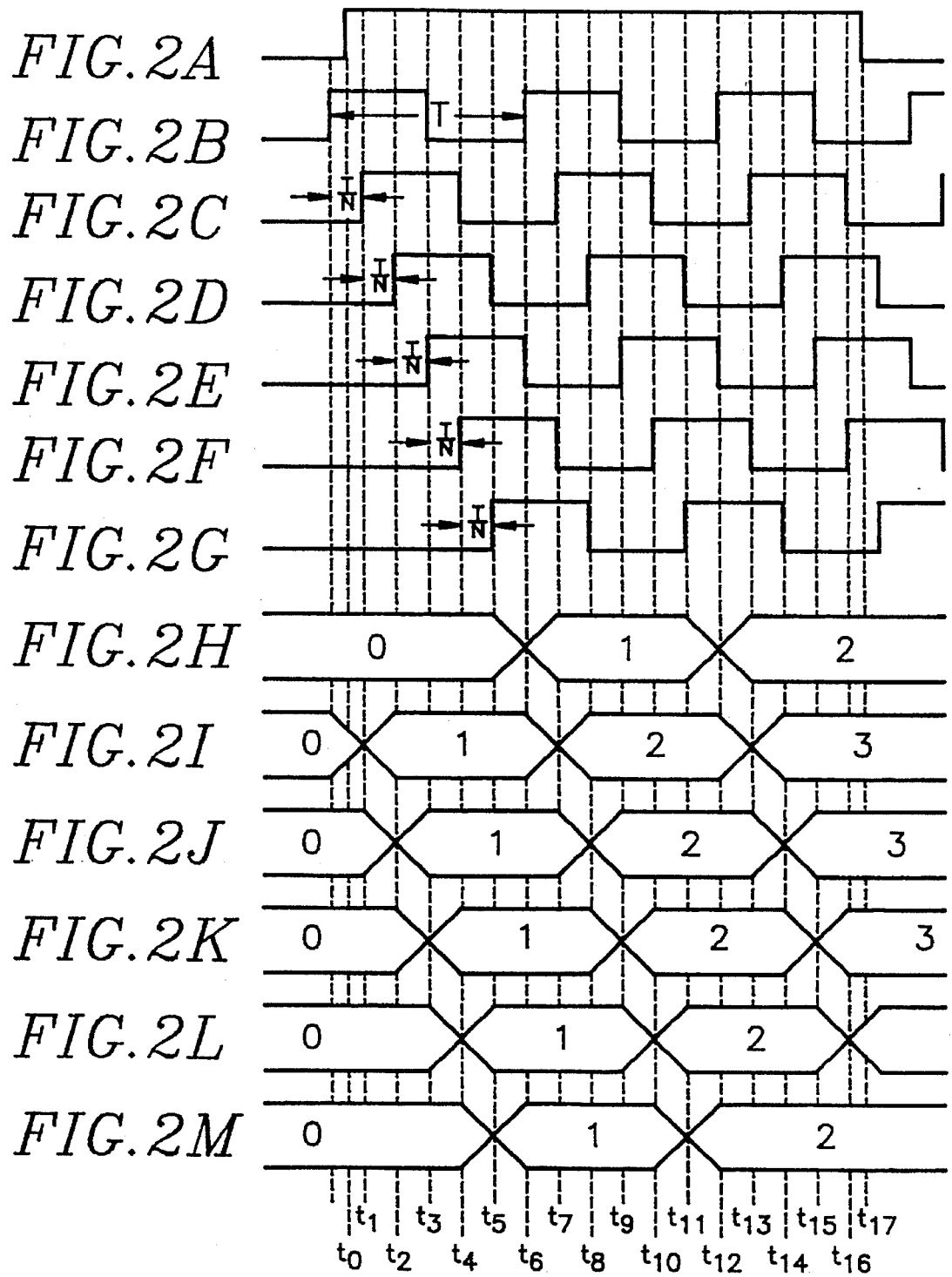

APPARATUS FOR MEASURING A PULSE DURATION

FIELD OF THE INVENTION

The present invention relates to a time measuring apparatus; and, more particularly, to an apparatus capable of accurately measuring a pulse duration of an input signal.

DESCRIPTION OF THE PRIOR ART

In general, the duration of an input pulse signal is measured by using a counter. When the input pulse signal is provided to an enable port of the counter and a clock signal in the form of a clock pulse train having a period(T) is provided to the counter, the counter counts the number of rising edges or falling edges of the clock pulses contained in the clock signal during the duration of the input pulse signal. And then, the duration of the input pulse signal is determined by multiplying the clock pulse period(T) and the number of counted clock pulses.

In the scheme described above, the accuracy of the measured input pulse duration is inherently limited by the clock pulse period(T); and, accordingly, in order to enhance the accuracy or reliability of the measurement, it is inevitable to employ a clock signal having a shorter clock pulse period capable of providing a desired measurement accuracy, which is not cost-effective.

SUMMARY OF THE INVENTION

It is, therefore, a primary object of the invention to provide an improved apparatus for accurately measuring an input pulse duration by using a simple delay circuit.

In accordance with the invention, there is provided an apparatus for measuring a duration(Y) of an input pulse signal(I), which comprises: a clock for generating a clock signal in the form of a clock pulse train having a period(T); a delay block for delaying the clock signal and providing N-1 number of delayed clock signals, each of the delayed clock signals delayed by a delay time((T/N)*i), N being a positive integer more than 1 and i being an integer from 1 to N-1; a counting block for counting the number of clock pulses contained in the clock signal and each of the delayed clock signals, respectively, during the duration(Y) of the input pulse signal(I) and providing count values; and a calculator for detecting a maximum count value(n) among the count values provided from the counting means and calculating the duration(Y) of the input pulse signal(I) based on the maximum count value(n).

BRIEF DESCRIPTION OF THE DRAWINGS

The above and other objects and features of the present invention will become apparent from the following description of preferred embodiments given in conjunction with the accompanying drawings, in which:

FIGS. 2A–2M provide time diagrams generated from the respective elements shown in FIG. 1.

DETAILED DESCRIPTION OF THE PREFERRED EMBODIMENTS

Figure 1:
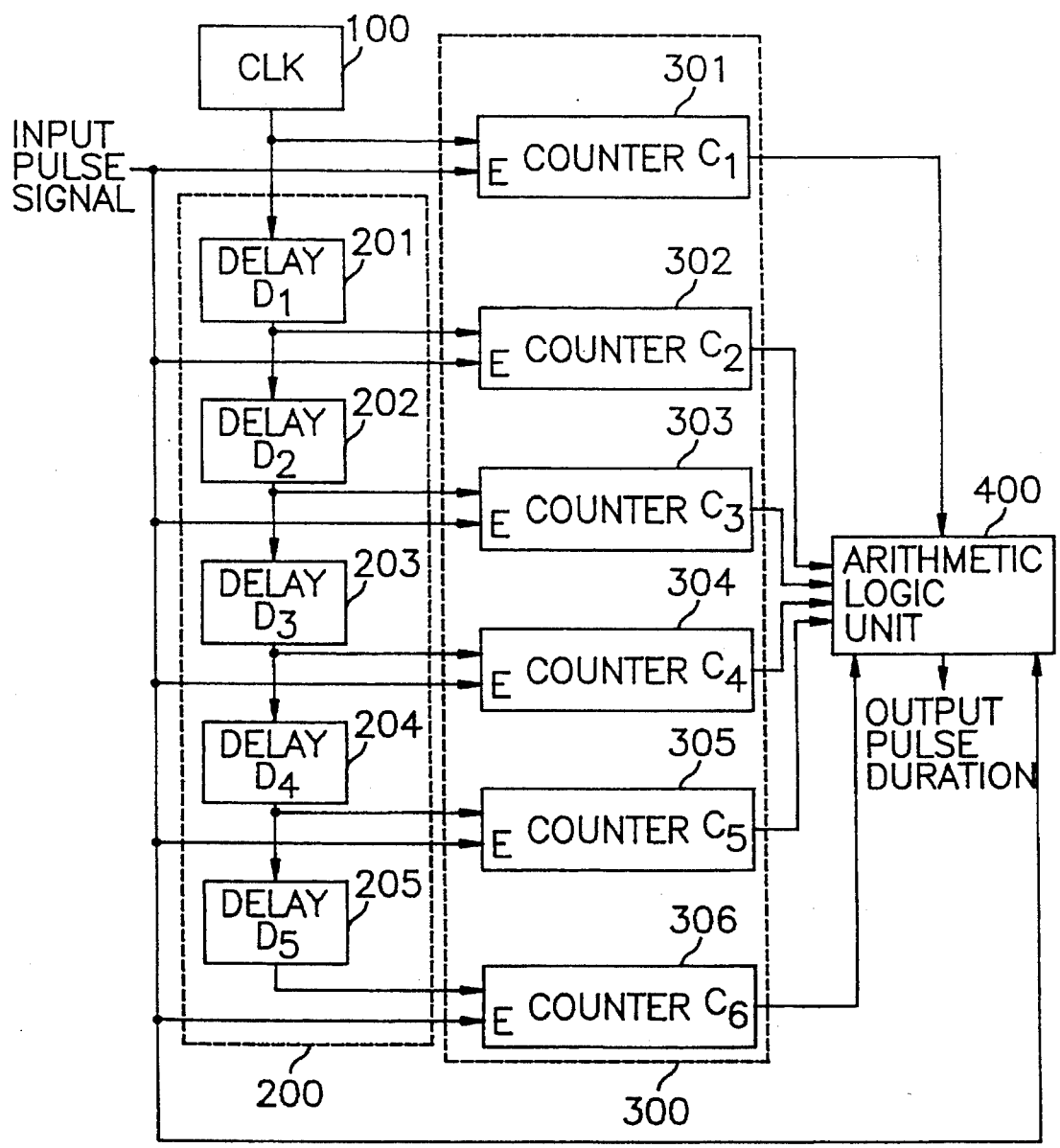
FIG. 1 represents a block diagram of an apparatus for measuring a duration of an input pulse signal in accordance with the present invention.

Referring to FIG. 1, there is shown a block diagram of a pulse duration measuring apparatus in accordance with the present invention. The inventive pulse duration measuring apparatus includes a clock(CLK) unit 100, a time-delay block 200, a counting block 300 and an arithmetic logic unit(ALU) 400.

Referring to FIGS. 2A to 2M, there are shown timing diagrams generated from the respective elements shown in FIG. 1.

Details of the inventive pulse duration measuring apparatus will be described with reference to FIG. 2A to 2M.

An input pulse signal(I) having a rising edge at a point $t_0$ and a falling edge at a point $t_{17}$ as shown in FIG. 2A is inputted to the counting block 300 and the ALU 400.

The CLK unit 100 generates a clock signal in the form of a clock pulse train having a period(T) as shown in FIG. 2B. The clock signal is provided to the time-delay block 200 and the counting block 300.

The time-delay block 200 includes N-1 (e.g., 5) number of time-delay elements, wherein the time-delay elements are coupled in a cascade manner and N is a positive integer (e.g., 6). FIGS. 2C to 2G illustrate exemplary timing diagrams of delayed clock signals provided from the 1st to the 5th time-delay elements ($D_1$ to $D_5$) 201 to 205, respectively.

First, as shown in FIG. 2C, the 1st time-delay element($D_1$) 201 delays the clock signal by a delay time(T/N) to provide a first delayed clock signal to a succeeding time-delay element, i.e., 2nd time-delay element($D_2$) 202 and the counting block 300. And, as shown in FIG. 2D, the 2nd time-delay element($D_2$) 202 also delays the first delayed clock signal by the delay time(T/N) to provide a second delayed clock signal to the 3rd time-delay element($D_3$) 203 and the counting block 300. The function of following time-delay elements($D_3$ to $D_5$) 203 to 205 is identical to that of the 1st and the 2nd time-delay elements($D_1$ and $D_2$) 201 and 202.

The counting block 300 includes N, e.g., 6, number of counters connected in a parallel fashion, wherein the Mth counter($C_M$) corresponds to the (M-1)st time-delay element($D_{M-1}$). Each of the 2nd to the 6th counters(C2 to C6) 302 to 306 receives the delayed clock signal fed from the corresponding time-delay element, but the 1st counter($C_1$) 301 receives the clock signal fed from the CLK unit 100. The input pulse signal(I) is provided to an enable port(E) in each of the counters(C1 to C6) 301 to 306.

The counting block 300 counts the number of clock pulses contained in each of the clock signals and each of the delayed clock signals between the rising edge point $t_0$ and the falling edge point $t_{17}$ of the input pulse signal(I). FIGS. 2H to 2M illustrate exemplary timing diagrams of count values provided from the 1st to the 6th counters($C_1$ to $C_6$) 301 to 306, respectively.

Each counter performs the counting operation at a rising edge of the clock pulse and generates a present count value until the occurrence of a next rising edge. Specifically, as shown in FIG. 2H, the 1st counter($C_1$) 301 counts the count value 1 at a first rising edge point $t_6$ of the clock pulse of the clock signal fed from the CLK unit 100 and generates the count value 1 until a second rising edge point $t_{12}$. Then, at the falling edge point $t_{17}$ of the input pulse signal(I), the 1st counter($C_1$) 301 stops the counting operation and the count value 2 therefrom is maintained without change.

And a second counter($C_2$) 302 generates the count value 1 at the first rising edge point $t_1$ of the clock pulse of the first delayed clock signal fed from the 1st time-delay element($D_1$) 201, the count value 2 at a second rising edge point $t_7$ and the count value 3 at a third rising edge point $t_{13}$ as shown in FIG. 2I. The function of following counters($C_3$ to $C_6$) 303 to 306 is identical to that of the 1st and the 2nd counters($C_1$ and $C_2$) 301 and 302.

The count values provided from the counters($C_1$ to $C_6$) 301 to 306 are provided to the ALU 400.

The ALU 400 receives the input pulse signal(I) and the count values from the counting block 300.

After the falling edge point $t_{17}$ of the input pulse signal(I), there can be two types n and n-1, e.g., 3 and 2, of count values fed from the counters($C_1$ to $C_6$) 301 to 306 as can be seen in FIG. 2H to 2M. The ALU 400 detects a maximum count value(n) among the count values fed from the counting block 300 and the number(p) of the counters providing the maximum count value(n). Based on the detection, it is determined that the maximum count value(n) is 3 and the number(p) of the counters is 3. Accordingly, the ALU unit 400 calculates the duration(Y) of the input pulse signal(I) as follows:

$$\begin{aligned} Y &= (n-1)*T + p*T/N \\ &= (3-1)*T + 3*T/6 \\ &= 2.5T \end{aligned}$$

As can be seen from the above equation, the duration(Y) of the input pulse signal(I) calculated by using the inventive duration measuring apparatus is 2.5T, which is almost identical to the real duration of the input pulse signal(I), whereas the value calculated by using the conventional apparatus is 2T.

While the present invention has been described with respected to the particular embodiments, it will be apparent to those skilled in the art that various changes and modification may be made without departing from the scope of the invention as defined in the following claim.

What is claimed is:

1. An apparatus for measuring a duration(Y) of an input pulse signal(I), which comprises:

means for generating a clock signal in the form of a clock pulse train having a period(T);

means for delaying the clock signal and providing N-1 number of delayed clock signals, each of the delayed clock signals being delayed by a delay time($(T/N)*i$), N being a positive integer greater than 1 and i being an integer from 1 to N-1;

means for counting the number of clock pulses contained in the clock signal and each of the delayed clock signals, respectively, during the duration(Y) of the input pulse signal(I) and providing the count values; and means for detecting a maximum count value(n) among the count values provided from the counting means and calculating the duration(Y) of the input pulse signal(I) based on the maximum count value(n).

2. The apparatus according to claim 1, wherein said calculating means calculates the duration(Y) of the input pulse signal(I) as:

$$Y=(n-1)*T+p*T/N$$

wherein p is the number of the maximum count value(n) among the count values fed from the counting means.

* * * * *